United States Patent
Tanaka et al.

(10) Patent No.: US 10,941,492 B2
(45) Date of Patent: Mar. 9, 2021

(54) SUBSTRATE TREATING METHOD

(71) Applicant: SCREEN Holdings Co., Ltd., Kyoto (JP)

(72) Inventors: Yuji Tanaka, Kyoto (JP); Chisayo Nakayama, Kyoto (JP); Masahiko Harumoto, Kyoto (JP); Masaya Asai, Kyoto (JP); Yasuhiro Fukumoto, Kyoto (JP); Tomohiro Matsuo, Kyoto (JP); Takeharu Ishii, Kyoto (JP)

(73) Assignee: SCREEN Holdings Co., Ltd.

(*) Notice: Subject to any disclaimer, the term of this patent is extended or adjusted under 35 U.S.C. 154(b) by 0 days.

(21) Appl. No.: 15/854,011

(22) Filed: Dec. 26, 2017

(65) Prior Publication Data
US 2018/0230599 A1 Aug. 16, 2018

(30) Foreign Application Priority Data

Feb. 14, 2017 (JP) .............................. JP2017-025227

(51) Int. Cl.
*C23C 16/56* (2006.01)
*H01L 21/687* (2006.01)
(Continued)

(52) U.S. Cl.
CPC .......... *C23C 16/56* (2013.01); *C23C 16/4408* (2013.01); *H01L 21/6719* (2013.01);
(Continued)

(58) Field of Classification Search
CPC ......... H01L 21/67109; H01L 21/67115; H01L 21/67155; H01L 21/67253; H01L 21/67389; H01L 21/67393; H01L 21/67757; H01L 21/67769; H01L 21/67772; H01L 21/68742;
(Continued)

(56) References Cited

U.S. PATENT DOCUMENTS 3,909,953 A * 10/1975 Hemsath ................. F23G 7/065
                                                       34/450
6,403,924 B1 * 6/2002 Hayashi ............ H01L 21/67109
                                                       219/390
(Continued)

FOREIGN PATENT DOCUMENTS

JP    2000-040698 A      2/2000
JP    2001-455523    *   6/2001
(Continued)

OTHER PUBLICATIONS

Office Action dated Aug. 20, 2019 for corresponding Korean Patent Application No. 10-2017-0182304.
(Continued)

*Primary Examiner* — Edward Chin
(74) *Attorney, Agent, or Firm* — Ostrolenk Faber LLP

(57) ABSTRACT

Disclosed is a substrate treating method for performing a heat treatment of a substrate having a treated film formed thereon in a heat treating space of a heat treating chamber. The method includes an exhaust step of performing exhaust of gas within the heat treating space, an inert gas supply step of supplying inert gas into the heat treating space, and a heat treating step of performing the heat treatment of the substrate in the heat treating space.

20 Claims, 4 Drawing Sheets

(51) Int. Cl.
*H01L 21/67* (2006.01)
*C23C 16/44* (2006.01)

(52) U.S. Cl.
CPC .. *H01L 21/67098* (2013.01); *H01L 21/67109* (2013.01); *H01L 21/67126* (2013.01); *H01L 21/67248* (2013.01); *H01L 21/68742* (2013.01)

(58) Field of Classification Search
CPC ........... H01L 21/67098; Y10S 414/139; Y10S 414/135; Y10S 414/137; Y10T 29/41; C23C 16/56; C23C 16/4408
See application file for complete search history.

(56) References Cited

U.S. PATENT DOCUMENTS

| | | | | |
|---|---|---|---|---|
| 6,501,191 | B2 * | 12/2002 | Tanaka | C30B 33/005 118/724 |
| 6,928,878 | B1 * | 8/2005 | Eriksen | G01L 9/0042 73/724 |
| 8,884,382 | B2 * | 11/2014 | Stetter | G01N 27/00 257/414 |
| 9,375,748 | B2 * | 6/2016 | Harumoto | G03F 7/3021 |
| 9,552,980 | B2 * | 1/2017 | Ozaki | H01L 21/32105 |
| 2002/0063119 | A1 | 5/2002 | Tanaka et al. | 219/390 |
| 2004/0058560 | A1 * | 3/2004 | Ranish | H01L 21/324 438/795 |
| 2013/0259457 | A1 | 10/2013 | Yokouchi et al. | 392/416 |
| 2014/0022521 | A1 | 1/2014 | Harumoto et al. | 355/27 |
| 2014/0273522 | A1 | 9/2014 | Rathsack | 438/781 |
| 2015/0228512 | A1 | 8/2015 | Muramatsu et al. | |
| 2016/0068430 | A1 | 3/2016 | Suenaga et al. | |

FOREIGN PATENT DOCUMENTS

| | | | |
|---|---|---|---|
| JP | 2002-164334 | A | 6/2002 |
| JP | 2002-261087 | A | 9/2002 |
| JP | 2004-336067 | A | 11/2004 |
| JP | 3942602 | B2 * | 7/2007 |
| JP | 2014-022570 | A | 2/2014 |
| JP | 2014-87781 | A | 5/2014 |
| JP | 2015-035586 | A | 2/2015 |
| JP | 2016-58585 | A | 4/2016 |
| JP | 2016-518701 | A | 6/2016 |
| KR | 20160113410 | A * | 9/2016 |
| WO | WO 2013/146118 | A1 | 10/2013 |

OTHER PUBLICATIONS

Office Action dated Feb. 20, 2019 for corresponding Republic of China Patent Application No. 106145500.

Office Action dated Feb. 7, 2020 for corresponding Korean Patent Application No. 10-2017-0182304.

Office Action and Search Report dated Jan. 6, 2021 for corresponding Japanese Patent Application No. 2017-025227.

* cited by examiner

SUBSTRATE TREATING METHOD

BACKGROUND OF THE INVENTION

(1) Field of the Invention

The present invention relates to a substrate treating method for performing a heat treatment of a semiconductor wafer, a substrate for liquid crystal display, a substrate for flat panel display (FPD) like a substrate for organic electroluminescence (EL), a substrate for optical display, a magnetic disk substrate, an optical magnetic disk substrate, a substrate for photomask, and a solar cell substrate (hereinafter, simply referred to as a substrate).

(2) Description of the Related Art

In recent process technologies, attention has been focused on a DSA process, for example, as a technology instead of immersion lithography or extreme ultraviolet (EUV) lithography. The DSA process is performed with a directed self-assembly (DSA) technology using micro phase separation of a block co-polymer for achieving much finer design rules on substrates.

In the currently-used substrate treating method in the DSA process, a block co-polymer (BCP) is applied to a substrate for deposition of a treated film, and thereafter, a heat treatment of heating the treated film on the substrate is performed in a heat treating space of a heat treating chamber, whereby (phase) separation of two types of polymers in the treated film is performed. Then, etching is performed to one of the (phase) separated polymers, whereby fine patterns are formed. See, for example, Japanese Unexamined Patent Publication No. 2014-22570A.

However, the example of the currently-used apparatus with such a configuration has the following problems.

Specifically, in the currently-used method, such a problem may arise as the polymer in the treated film is not able to be separated appropriately depending on a treatment atmosphere in the heat treating space. Moreover, the deposited film may pose some difficulty in its property and performance depending on a treatment atmosphere in the heat treating space also during a process of performing heat treatment of the substrate within the heat treating chamber other than the DSA process, the process including process of depositing a film by a heat treatment after a spin on glass (SOG) solution is applied to the substrate.

SUMMARY OF THE INVENTION

The present invention has been made regarding the state of the art noted above, and its one object is to provide a substrate treating method that allows appropriate film deposition by producing a suitable treatment atmosphere in a heat treating space in a heat treating process.

To fulfill the above object, Inventors of the present invention have made intensive research and attained the following findings.

Attention was focused on an influence of oxygen in a heat treating space in view of a relationship between various parameters of the heat treating space and a separated condition of a polymer after a heat treatment under different treatment atmospheres in the heat treating space of the heat treating chamber. Such attention was made based on the finding that inappropriate phase separation of the polymers was performed during the heat treatment where an oxygen concentration in the heat treating space was lowered incompletely. Now, it is estimated that, if the oxygen concentration is lowered incompletely, the polymer is adversely affected upon phase separation thereof, and accordingly normal phase separation is inhibited. Also in heat treatment processes other than the DSA process, oxidation caused by oxygen adversely affects a property of film deposition. The present invention based on such finding as above is constituted as under.

One aspect of the present invention provides a substrate treating method for performing a heat treatment of a substrate having a treated film formed thereon in a heat treating space of a heat treating chamber. The method includes an exhaust step of performing exhaust of gas within the heat treating space; an inert gas supply step of supplying inert gas into the heat treating space; and a heat treating step of performing the heat treatment of the substrate in the heat treating space.

With the aspect of the present invention, only the exhaust step is firstly performed for exhausting the gas within the heat treating space. Thereafter, the inert gas supply step is performed to supply the inert gas into the heat treating space. Since the inert gas is supplied with negative pressure in the heat treating space, a larger difference occurs between the pressure in the heat treating space and the pressure of the supplied inert gas in contrast to a situation where only the inert gas is supplied, only exhaust is performed, or the inert gas is supplied simultaneously with the exhaust. As a result, the gas within the heat treating space is able to be replaced by the inert gas for a shorter period of time. Moreover, an oxygen concentration in the heat treating space is extremely lowered. Consequently, a treatment atmosphere in the heat treating space during the heat treating step is able to be made suitable for the heat treatment process, leading to appropriate film deposition.

It is more preferred in the aspect of the present invention that the inert gas supply step includes a first inert gas supply step immediately after the exhaust step, and a second inert gas supply step immediately before the heat treating step, and that the first inert gas supply step is performed at a supply amount of the inert gas sufficient for maintaining negative pressure within the heat treating chamber.

The first inert gas supply step is performed under the negative pressure by exhausting the gas at an amount larger than the supply amount of the inert gas. Here, oxygen stagnated at corners within the heat treating chamber is easily discharged along with flow of the exhausted gas rather than flow of the inert gas. As a result, a much lowered oxygen concentration is obtainable.

Moreover, it is preferred in the aspect of the present invention that, in the second inert gas supply step, only the inert gas is supplied into the heat treating chamber while the exhaust in the exhaust step stops.

Here, the exhaust stops and only the inert gas is supplied, leading to flow variation within the heat treating space. Accordingly, discharge of the oxygen stagnated in the heat treating space HS is obtainable along with flow variation, achieving a much lowered oxygen concentration.

It is preferred in the aspect of the present invention that the exhaust step is shifted to the heat treating step when a heat treatment shifting time elapses from the exhaust step, the heat treatment shifting time being determined as lapsed time premeasured from the exhaust step during which an oxygen concentration in the heat treating space is lowered to a target value or less.

The step is shifted to the heat treating step by merely measuring the heat treatment shifting time, achieving the simplified configuration of the heat treating chamber and reduction in cost needed for treatment.

It is preferred that the aspect of the present invention further includes an oxygen concentration measuring step of measuring an oxygen concentration in the heat treating space before the heat treating step, and the heat treating step is performed only when the oxygen concentration is equal to or less than a target value.

The heat treating step is performed only when the oxygen concentration is determined equal to or less than the target value through the oxygen concentration measuring step, achieving reliable treatment.

Moreover, it is preferred in the aspect of the present invention that an alarm is given when the oxygen concentration during the oxygen concentration measuring step does not reach the target value or less.

An alarm is given when the oxygen concentration does not reach the target value, leading to avoidance of shifting to the heat treatment and thus prevention of inappropriate treatment.

Moreover, it is preferred in the aspect of the present invention that the exhaust step performs the exhaust of the gas from an exhaust port that is formed laterally of the heat treating chamber and has a flow sectional area corresponding to a vertical sectional area of the heat treating space.

Here, the exhaust is performed from the large flow sectional area, leading to efficient exhaust in the exhaust step.

Moreover, it is preferred in the aspect of the present invention that the exhaust step performs the exhaust of the gas from through holes into which support pins moving forward/backward in a heat treating plate for placing the substrate placed are inserted in communication with the heat treating space.

The gas is exhausted from the through holes formed adjacent to a position where the substrate is placed during the heat treatment, achieving the efficiently lowered oxygen concentration around the substrate that exerts a large influence during the heat treatment. Moreover, since dust generated during slide of the support pins is discharged without entering into the heat treating space, the substrate is able to be treated cleanly.

Moreover, it is preferred in the aspect of the present invention that the substrate has a treated film formed thereon that is made from a directed self-assembly material.

This makes the treatment atmosphere in the heat treating space suitable for the DSA process, achieving appropriate (phase) separation of the polymer.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Figure 1:
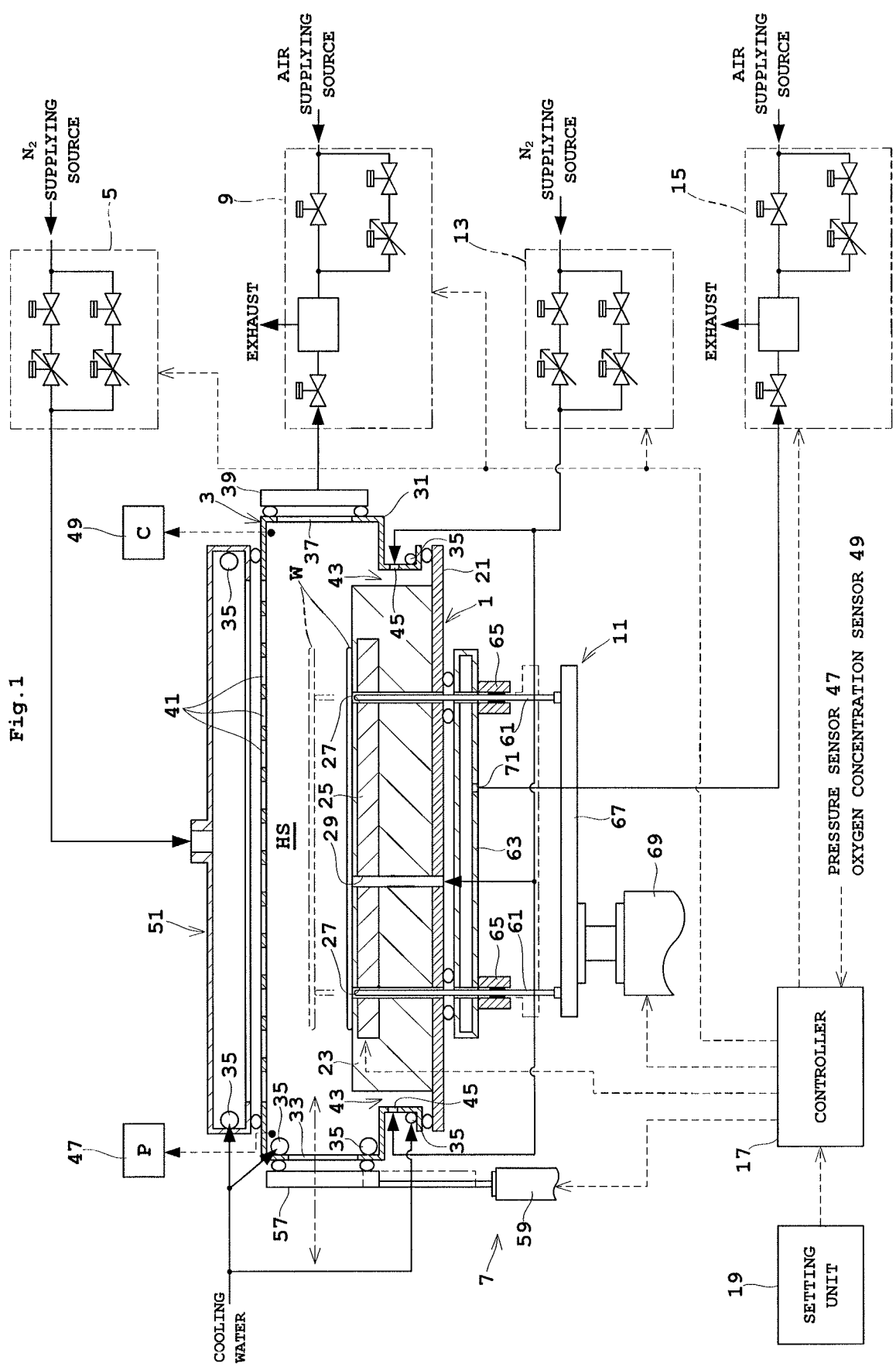
FIG. 1 schematically illustrates an overall configuration of a substrate treating apparatus according to one embodiment of the present invention.

The following describes one embodiment of the present invention with reference to drawings. FIG. 1 schematically illustrates an overall configuration of a substrate treating apparatus according to one embodiment of the present invention.

The substrate treating apparatus according to the present embodiment for executing a substrate treating method is used for performing a heat treatment of a substrate W. Examples of the substrate W in the present embodiment include one having a treated film made from a directed self-assembly material deposited on a front face thereof.

The substrate treating apparatus according to the present embodiment includes a heat treatment plate unit 1, a heat treating chamber 3, an upper gas supply unit 5, a shutter 7, a chamber exhaust unit 9, a support pin lifting member 11, a lower gas supply unit 13, a support pin seal exhaust unit 15, a controller 17, and a setting unit 19.

The heat treatment plate unit 1 places the substrate W on its top face for performing a heat treatment of the substrate W. The heat treatment plate unit 1 includes a base plate 21, a heat treating plate 23, and a heater 25. The base plate 21 is attached to a lower part of the heat treating plate 23, and is also attached to a lower part of the heat treating chamber 3 together with the heat treating plate 23. The heat treating plate 23 is composed of a material whose base material is a metal, such as copper (Cu) and aluminum (Al), with a high thermal conductivity. The heater 25 is embedded in the heat treating plate 23, and controls a temperature of the heat treating plate 23. For instance, the heater 25 controls a temperature of the heat treating plate 23 within a range of 300 to 400° C. The heat treating plate 23 has proximity balls, not shown, embedded in its rear face for locating a rear face of the substrate W away from a rear face of the heat treating plate 23 by a given interval (e.g., 0.1 mm).

The heat treating plate 23 has through holes 27 formed at positions corresponding to vertexes of a regular triangle in plan view. The through holes 27 each pass from a top face to the rear face of the heat treating plate 23, and also pass through the base plate 21. Holder pins mentioned later are inserted into the through holes 27, respectively. Moreover, a topside plate supply port 29 passing the heat treating plate 23 and the base plate 21 in a vertical direction is formed around the center of the heat treating plate 23.

The heat treating chamber 3 includes a cover 31. The cover 31 includes an opening at a lower portion thereof, and the heat treatment plate unit 1 is attached to the opening. The cover 31 shows a shape that covers a lateral side and an upper side of the heat treatment plate unit 1. A space is formed between the ceiling of the cover 31 and the top face of the heat treating plate 23. The space corresponds to a heat treating space HS. The cover 31 has a load outlet 33 formed on a first side face thereof. The load outlet 33 is used for loading a substrate W to be treated into the heat treating space HS and unloading the treated substrate W from the heat treating space HS. A cooling pipe 35 is attached around the load outlet 33. The cooling pipe 35 cools the cover 31 with cooling water supplied thereto, and protects an O-ring around the load outlet 33.

The cover 31 has an exhaust port 37 formed on a second side face thereof, which is opposite to the load outlet 33. The exhaust port 37 is used for exhausting gas within the cover 31. The exhaust port 37 has a flow path sectional area corresponding to a vertical sectional area of the heat treating space HS. An exhaust port cover 39 is removably attached to the outside of the exhaust port 37 via the O-ring. The ceiling of the cover 31 includes a plurality of through holes 41. An annular gap 43 in plan view is present between the heat treatment plate unit 1 and an outer peripheral surface of the heat treating plate 23 of the cover 31 around the heat treatment plate unit 1. A side face of the cover 31 facing to the gap 43 has openings 45 each in communication with the gap 43. The openings 45 are, for example, formed at two positions facing to each other in plan view. The cooling pipe 35 is disposed at an outer face of the cover 31 below the openings 45. The cooling pipe 35 protects the O-ring between the cover 31 and the base plate 21. The lower gas supply unit 13 supplies nitrogen gas into the openings 45 and the topside plate supply port 29. The lower gas supply unit 13 includes a plurality of flow rate regulating valves or on-off valves for allowing regulation of a flow rate of the nitrogen gas.

The exhaust port 37 exhausts gas through the exhaust port having the flow path sectional area corresponding to the vertical sectional area of the heat treating space HS, leading to efficient exhaust.

A pressure sensor 47 is disposed above the cover 31 adjacent to the load outlet 33. An oxygen concentration sensor 49 is disposed above the cover 31 adjacent to the exhaust port 37. The pressure sensor 47 determines pressure within the heat treating space HS. The oxygen concentration sensor 49 determines an oxygen concentration within the heat treating space HS. As is described hereunder, it should be noted that the oxygen concentration sensor 49 is only used when an examination is performed to determine lapsed time during which the oxygen concentration is lowered to a target value or less, and accordingly, the oxygen concentration sensor 49 is not necessarily provided during normal treatment.

A gas supply buffer 51 is disposed above the cover 31. Here, nitrogen ($N_2$) gas supplied from the center of the top face of the cover 31 is supplied from an underside opening of the cover 31, having a larger area than the center of the top face, through a plurality of through holes 41 into the heat treating space HS. An O-ring is disposed between the top face of the cover 31 and an under face of the gas supply buffer 51. Another cooling pipe 35 is disposed inside of the gas supply buffer 51. The cooling pipe 35 protects the O-ring. The upper gas supply unit 5 supplies nitrogen gas as inert gas into the gas supply buffer 51 mentioned above. The upper gas supply unit 5 includes two flow rate regulating valves, for example, that allow switch of a flow rate of the nitrogen gas in two steps.

The shutter 7 is disposed on a front face of the load outlet 33. The shutter 7 includes the load outlet 33, a shutter body 57, and an actuator 59. The shutter body 57 is lifted by the actuator 59 whose actuating pieces move upwardly/downwardly in a vertical direction. The shutter body 57 closes the load outlet 33 via the O-ring when moving upwardly. When the actuator 59 is brought into an actuated state, the shutter body 57 moves to a position denoted by solid lines in FIG. 1 to close the load outlet 33. When the actuator 59 is brought into a non-actuated state, the shutter body 57 moves downwardly to a position denoted by chain double-dashed lines in FIG. 1 to open the load outlet 33.

The chamber exhaust unit 9 exhausts gas within the heat treating space HS via the exhaust port cover 39 mentioned above. The chamber exhaust unit 9 includes a plurality of on-off valves, flow rate regulating valves, aspirators, and the like, for exhausting the gas within the heat treating space HS by supplying air from an air supplying source. It should be noted that the chamber exhaust unit 9 may be formed by an exhaust pump and the like instead of the aspirators and the air supplying source.

The support pin lifting member 11 includes three support pins 61 (two of which are only denoted in FIG. 1 for an illustrational reason), a manifold 63, mechanical seals 65, a lifting member 67, and an actuator 69. The support pins 61 are inserted into the through holes 27, respectively. The support pins 61 pass through the manifold 63 and are coupled at lower ends thereof to the lifting member 67 via the mechanical seals 65. An O-ring is attached between the top face of the manifold 63 and the base plate 21 so as to surround each of the through holes 27. Upper ends of the mechanical seals 65 are attached to an under face of the manifold 63. The mechanical seals 65 are metal seals that allow upward/downward movement of the support pins 61 while supporting outer peripheral surfaces of the support pins 61 in a sealing manner. The manifold 63 shows a triangle shape in plan view, and has one space formed therein. The manifold 63 has an exhaust port 71 formed at one region thereof in communication with the space.

The lifting member 67 shows an annular shape in plan view, and is moved upwardly/downwardly by the actuator 69. The actuator 69 is disposed in an attitude where the actuating pieces are moved forward/backward in the vertical direction. When the actuator 69 is brought into an actuated state, the support pins 61 project to move to the delivery position denoted by chain double-dashed lines in FIG. 1. When the actuator 69 is brought into a non-actuated state, the support pins 61 moves to the retracted position denoted by solid lines in FIG. 1. When the support pins 61 move to the retraced position, the substrate W is placed on the top face of the heat treating plate 23.

The support pin seal exhaust unit 15 exhausts gas from an exhaust port 71 of the manifold 63. The support pin seal exhaust unit 15 includes a plurality of on-off valves, flow rate regulating valves, aspirators, and the like for exhausting gas within the heat treating space HS through the manifold 63 and the through holes 27 by supplying air from an air supplying source. In addition, dust generated on the mechanical seals 65 is discharged simultaneously. It should be noted that the support pin seal exhaust unit 15 may be formed by a vacuum pump instead of the aspirators and the air supplying source.

The support pin seal exhaust unit 15 exhausts gas from the through holes 27 that are formed near a position where the substrate W is placed during the heat treatment. This achieves effective reduction in oxygen concentration around the substrate W that may influence film deposition largely during the heat treatment. Moreover, since the dust generated due to slide of the support pins 61 on the mechanical seals 65 is discharged without entering into the heat treating space HS, the substrate W is able to be treated cleanly.

The upper gas supply unit 5, the chamber exhaust unit 9, the lower gas supply unit 13, the support pin seal exhaust unit 15, and the actuators 59, 69 are controlled en bloc by a controller 17. The controller 17 contains a CPU, a memory, and a timer, each of which is not shown. The controller 17 causes the memory, not shown, to store in advance a plurality of recipes that specific procedures of the heat treatment. The setting unit 19 is operated by an operator to select one of the recipes and to provide an instruction for starting treatment or for operation when an alarm is given.

In the present embodiment, the memory not shown stores in advance a chamber exhaust time, a heat treatment shifting time, a heat treating time, a cooling time, and the like, and such time is referred to by the controller 17 as appropriately.

The heat treatment shifting time is lapsed time from an exhaust starting time when the oxygen concentration within the heat treating space HS is lowered to the target value or less in the heat treatment, which is to be mentioned later. This time is measured and determined in advance through examinations while the oxygen concentration sensor 49 is provided.

Figure 2:
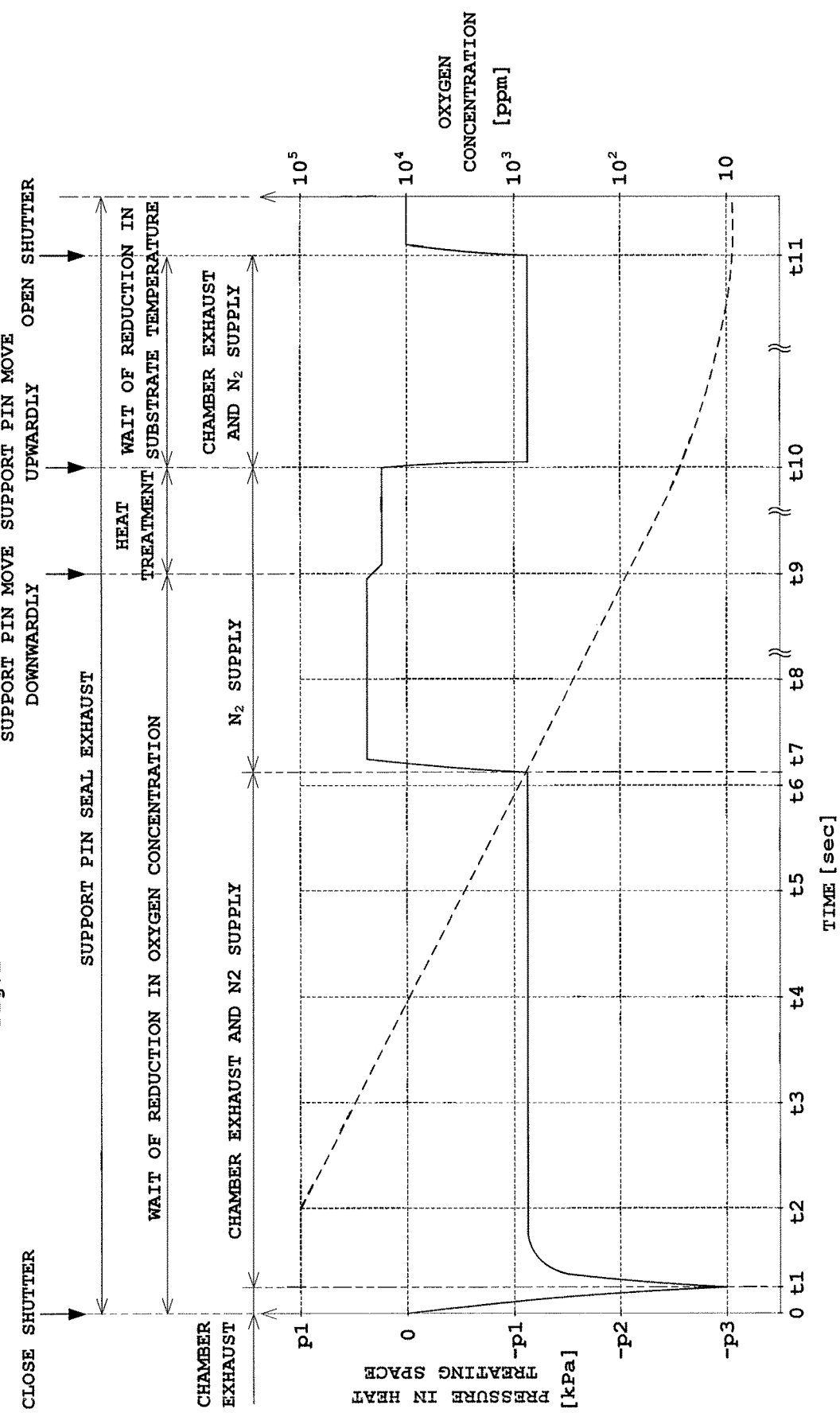
FIG. 2 is a time chart illustrating one example of treating a substrate according to the embodiment.
Figure 3:
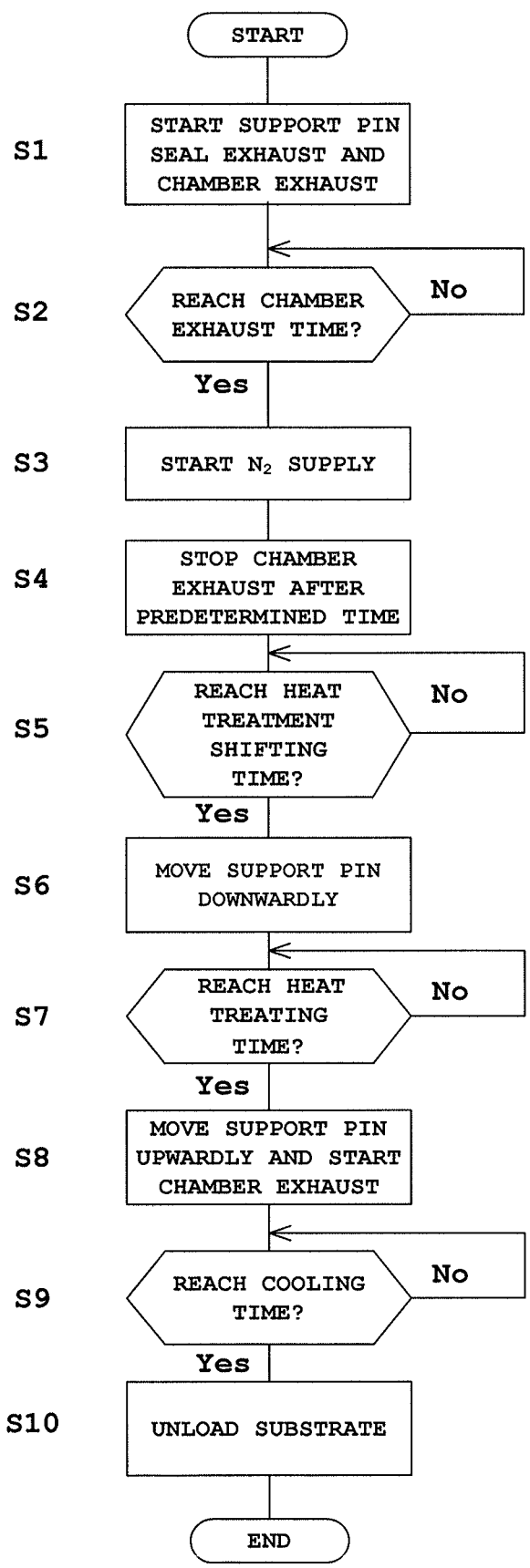
FIG. 3 is a flow chart illustrating the example of treating the substrate.

The following describes one example of the heat treatment by the substrate treating apparatus mentioned above with reference to FIGS. 2 to 4. It should be noted that FIG. 2 is a time chart illustrating one example of treating the substrate according to the present embodiment, and FIG. 3 is a flow chart illustrating one example of treating the substrate according to the present embodiment. Here, pressure within the heat treating space HS is denoted by solid lines, and an oxygen concentration in the heat treating space HS is denoted by dotted lines in the time chart of FIG. 2.

It is assumed that an initial state (at time 0 in FIG. 2) corresponds to a state where the substrate W, having a treated film made from a directed self-assembly material already deposited on its front face, is loaded from the load outlet 33 into the heat treating space HS, and is in a standby state while being located away from a surface of the heat treating plate 23 by the support pins 61 in the deliver position. Then, the actuator 59 is brought into the actuated state to close the load outlet 33 with the shutter body 57. Here, the heat treating plate 23 is already set at a treatment temperature (e.g., 350° C.).

Step S1

At time 0, the controller 17 causes the support pin seal exhaust unit 15 to start exhaust from the exhaust port 71, and causes the chamber exhaust unit 9 to start exhaust from the exhaust port 37. Accordingly, gas within the heat treating space HS starts to be exhausted, and pressure is sharply decreased to −p3 kPa at time t1 as the chamber exhaust time. It should be noted that the condition to make the pressure decreased to −p3 kPa at the time t1 as the chamber exhaust time is determined in advance through various examinations of adjusting an exhaust amount from the chamber exhaust unit 9 and the support pin seal exhaust unit 15. Simultaneously, the controller 17 also starts clocking. Such sharp exhaust produces the effect of preventing air from entering from the outside into the heat treating space HS by causing the shutter body 57 to adhere to the O-ring of the load outlet 33 tightly.

During a period of time 0 to time t1, the oxygen concentration is lowered by only the exhaust, which corresponds to the "exhaust step" in the present invention.

Steps S2 and S3

After clocking the time t1 as the chamber exhaust time, the controller 17 causes the upper gas supply unit 5 and the lower gas supply unit 13 to start supply of nitrogen gas. Accordingly, pressure within the heat treating space HS moves back sharply to the atmospheric pressure while negative pressure of around −p1 kPa is maintained. This is achieved by making the supply amount of nitrogen gas from the upper gas supply unit 5 and the lower gas supply unit 13 less than the exhaust amount from the chamber exhaust unit 9 and the support pin seal exhaust unit 15. During a period of the time t1 to time t7, the oxygen concentration is lowered through the exhaust and the supply of nitrogen gas.

During the period of the time t1 to the time t7, the negative pressure is maintained with the exhaust amount larger than the supply amount of the nitrogen gas. The oxygen stagnated at corners within the heat treating chamber 3 and the like is discharged by flow of the nitrogen gas more easily than by flow of the exhaust. Accordingly, this achieves more reduction in oxygen concentration.

Step S4

The controller 17 causes the chamber exhaust unit 9 to stop at the time t7 corresponding to time after a given period of time from the time 0, and the process is shifted to exhaust from support pin seal exhaust unit 15 and reduction in oxygen concentration by purge of supplying nitrogen gas from the upper gas supply unit 5 and the lower gas supply unit 13. This achieves variation in pressure in the heat treating space HS toward the atmospheric pressure, thereby maintaining the pressurized space. At this time, oxygen which may possibly be stagnated between the rear face of the substrate W and the heat treating plate 23 is able to be discharged along with the flow of the nitrogen gas. Moreover, oxygen may possibly be stagnated in the gap 43 around the heat treating plate 23. Then, supplying nitrogen gas from the opening 45 also leads to discharge of the oxygen. Consequently, an extremely lowered oxygen concentration is obtainable in the heat treating space HS.

Step S5

The controller 17 divides the process depending on whether or not the clocking time has reached the preset heat treatment shifting time. If the time has reached the heat treatment shifting time, the process is shifted to the next step S6. On the other hand, if the time has not reached the heat treatment shifting time, the step S5 is performed repeatedly. During the period of time t7 to time t9, the exhaust is stopped and the supply of the nitrogen gas is only performed, leading to flow variation within the heat treating space HS by the time t7. Accordingly, discharge of the oxygen stagnated in the heat treating space HS is obtainable along with the flow variation, achieving a much lowered oxygen concentration.

Here, the period of time t1 to t9 corresponds to the "inert gas supply step" in the present invention. In addition, the period of time t1 to t7 corresponds to the "first inert gas supply step" in the present invention, and the period of time t7 to t9 corresponds to the "second inert gas supply step" in the present invention.

Steps S6 and S7

When the time has reached the heat treatment shifting time, the controller 17 causes the actuator 69 to be brought into a non-actuated state, and causes the support pins 27 to move downwardly to the retracted position. Accordingly, the substrate W is placed adjacent to the heat treating plate 23, and the heat treatment of the substrate W is started. The controller 17 starts clocking and maintains this condition until time t10 at which the time reaches the heat treating time. Here, in the time t9, the oxygen concentration in the heat treating space HS is lowered to 100 ppm or less as the target value.

As noted above, the process is able to be shifted to the heat treatment by merely measuring the heat treating time without using any oxygen concentration meter 49. This achieves the simplified configuration of the substrate treating apparatus, leading to reduction in cost needed for the processing.

Step S8

When the clocking time has reached the heat treating time, the controller 17 causes the actuator 69 to actuate at the time t10 to move the support pins 27 upwardly. Accordingly, the substrate W is moved away from the heat treating plate 23 to the delivery position. The controller 17 causes the chamber exhaust unit 9 to actuate to start exhaust from the exhaust port 37, and to start clocking. This causes cooling of the substrate W.

The period of time t9 to t10 corresponds to the "heat treating step" in the present invention.

Step S9

The controller 17 divides the process depending on whether or not the clocking time has reached the cooling time. If the time has reached the cooling time, the process is shifted to the step S10 or otherwise the step S9 is performed repeatedly.

Step S10

If the time has reached the cooling time, the controller 17 stops the chamber exhaust unit 9, the upper gas supply unit 5, and the lower gas supply unit 13 at time t11. Then, the actuator 59 is brought into a non-actuated state, and causes the shutter body 57 to move downwardly to unload the substrate W.

With the aspect of the present embodiment, only the gas exhaust is firstly performed for exhausting gas within the heat treating space HS. Thereafter, the nitrogen gas is supplied for supplying the nitrogen gas into the heat treating space HS. Since the inert gas is supplied with negative pressure in the heat treating space, a larger difference occurs between the pressure in the heat treating space HS and the pressure of the supplied inert gas in contrast to a situation where only the inert gas is supplied, only exhaust is performed, or the inert gas is supplied simultaneously with the exhaust. As a result, the gas within the heat treating space HS is able to be replaced by the inert gas for a shorter period of time. Moreover, an oxygen concentration in the heat treating space HS is extremely lowered. Consequently, a treatment atmosphere in the heat treating space HS during the heat treating step is able to be made suitable for the heat treatment process, leading to appropriate film deposition. Especially when the substrate W has the treated film deposited thereon that is made from the directed self-assembly material, the treatment atmosphere in the heat treating space HS is able to be made suitable for the DSA process, achieving appropriate (phase) separation of the polymer.

<Modification>

Figure 4:
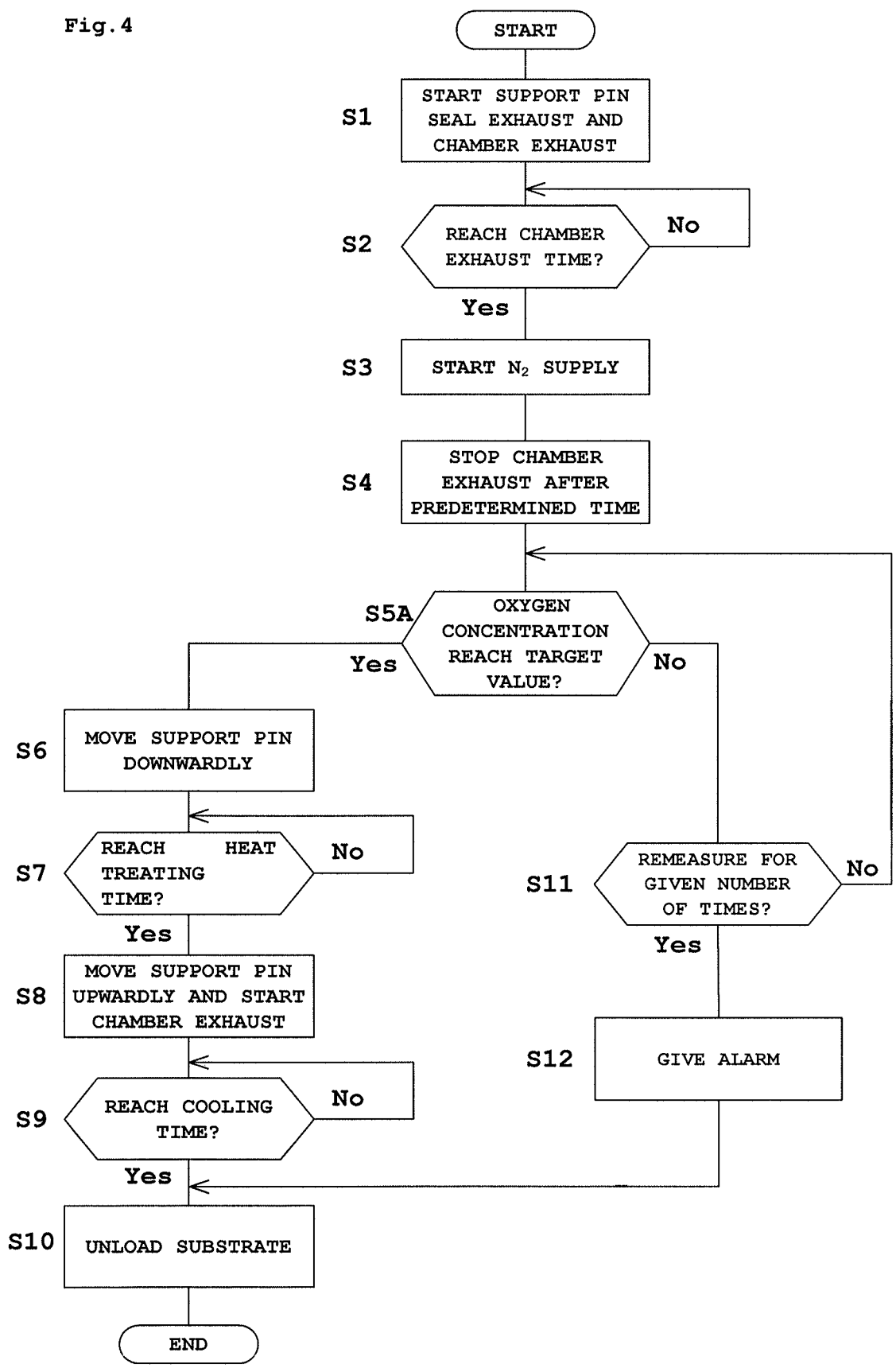
FIG. 4 is a flow chart illustrating one example of treating a substrate according to one modification of the present invention.

In the embodiment mentioned above, shifting to the heat treatment is performed by clocking the heat treatment shifting time without using the oxygen concentration sensor 49. However, such an embodiment is not limitative in the present invention. The following describes one modification of the present invention with reference to FIGS. 2 and 4. FIG. 4 is a flow chart illustrating one example of treating the substrate according to the modification.

This modification discloses treatment by the substrate treating apparatus having the oxygen concentration sensor 49. In this case, the step S5 of the treatment mentioned above is omitted, and additional steps S5A, S11, and S12 are newly performed.

In the step S5A, the controller 17 refers to the oxygen concentration from the oxygen concentration sensor 49, and divides the treatment in accordance with the resultant. In the step S5A, if the oxygen concentration is lowered to a target value or less, the process is shifted to the step S6 and the heat treatment. In contrast to this, if the oxygen concentration is not lowered to the target value or less, the number of remeasurement is determined in the step S11, and the step S5A is performed repeatedly until the remeasurement is performed by a given number of times (e.g., five times after a standby time of around 5 seconds). If the oxygen concentration is not still lowered to the target value or less, the process is shifted to the step S12 to give an alarm to an operator of the apparatus.

With the modification, the heat treatment is performed only if the oxygen concentration is actually determined to be the target value or less through the oxygen concentration measurement. This achieves reliable treatment of the substrate W. In addition, an alarm is given when the oxygen concentration does not reach the target value, leading to avoidance of shifting to the heat treatment and thus prevention of inappropriate treatment.

Moreover, it is also applicable to unload the substrate W with no alarm and no heat treatment by omitting the above step S12.

The present invention is not limited to the foregoing examples, but may be modified as follows.

(1) In the embodiment mentioned above, the substrate W has a treated film coated thereon that is made from a directed self-assembly material. Such a substrate W is not limitative in the present invention. For instance, the present invention is applicable to the treatment that the oxygen concentration in the heat treating space HS adversely affects, such as treatment of a substrate to which a spin on glass (SOG) solution is applied.

(2) In the embodiment mentioned above, the support pin seal exhaust unit 15 is successively operated in the exhaust step. However, the support pin seal exhaust unit 15 may be operated in cooperation with the chamber exhaust unit 9. This facilitates timing control of the exhaust.

(3) In the embodiment mentioned above, the exhaust step includes two steps, i.e., the first inert gas supply step of performing the exhaust and the supply of the nitrogen gas, and the second inert gas supply step of performing the supply of the nitrogen gas. However, such is not limitative in the present invention. For instance, the exhaust step may be performed by one step of performing the exhaust and the supply of the nitrogen gas. This achieves simplified control of switching between the supply and the exhaust.

(4) In the embodiment mentioned above, the chamber exhaust time is clocked as the period of time 0 to t1 when only the exhaust is firstly performed. However, timing of supplying the nitrogen gas may be determined in accordance with measured values by the pressure sensor 47. This achieves reliable treatment.

(5) In the embodiment mentioned above, nitrogen gas has been described as one example of the inert gas. However, another type of inert gas such as argon or helium may be used.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating method for performing a heat treatment of a substrate having a treated film formed thereon in a heat treating space of a heat treating chamber, the substrate treating method comprising, in this order:
   an exhaust step of performing exhaust of gas within the heat treating space;
   an inert gas supply step of supplying inert gas into the heat treating space;
   a step of bringing the heat treating space to a pressure higher than atmospheric pressure, after the inert gas supply step; and
   a heat treating step of performing the heat treatment of the treated film on the substrate in the heat treating space after the heat treating space has been brought to the pressure higher than atmospheric pressure.

2. The substrate treating method according to claim 1, wherein the inert gas supply step comprises a first inert gas supply step immediately after the exhaust step, and a second inert gas supply step immediately before the heat treating step, and the first inert gas supply step is performed at a supply amount of the inert gas sufficient for maintaining negative pressure within the heat treating chamber.

3. The substrate treating method according to claim 2, wherein in the second inert gas supply step, only the inert gas is supplied into the heat treating chamber while the exhaust in the exhaust step stops.

4. The substrate treating method according to claim 1, wherein the heat treating step is performed when a heat treatment shifting time elapses from the exhaust step, the heat treatment shifting time being determined as lapsed time premeasured from the exhaust step during which an oxygen concentration in the heat treating space is lowered to a target value or less.

5. The substrate treating method according to claim 2, wherein the exhaust step is shifted to the heat treating step when a heat treatment shifting time elapses from the exhaust step, the heat treatment shifting time being determined as lapsed time premeasured from the exhaust step during which an oxygen concentration in the heat treating space is lowered to a target value or less.

6. The substrate treating method according to claim 3, wherein the exhaust step is shifted to the heat treating step when a heat treatment shifting time elapses from the exhaust step, the heat treatment shifting time being determined as lapsed time premeasured from the exhaust step during which an oxygen concentration in the heat treating space is lowered to a target value or less.

7. The substrate treating method according to claim 1, further comprising:

an oxygen concentration measuring step of measuring an oxygen concentration in the heat treating space before the heat treating step, wherein the heat treating step is performed only when the oxygen concentration is equal to or less than a target value.

8. The substrate treating method according to claim 2, further comprising:

an oxygen concentration measuring step of measuring an oxygen concentration in the heat treating space before the heat treating step, wherein the heat treating step is performed only when the oxygen concentration is equal to or less than a target value.

9. The substrate treating method according to claim 3, further comprising:

an oxygen concentration measuring step of measuring an oxygen concentration in the heat treating space before the heat treating step, wherein the heat treating step is performed only when the oxygen concentration is equal to or less than a target value.

10. The substrate treating method according to claim 7, wherein an alarm is given when the oxygen concentration during the oxygen concentration measuring step does not reach the target value or less.

11. The substrate treating method according to claim 8, wherein an alarm is given when the oxygen concentration during the oxygen concentration measuring step does not reach the target value or less.

12. The substrate treating method according to claim 9, wherein an alarm is given when the oxygen concentration during the oxygen concentration measuring step does not reach the target value or less.

13. The substrate treating method according to claim 1, wherein the exhaust step performs the exhaust of the gas from an exhaust port that is formed laterally of the heat treating chamber and has a flow sectional area corresponding to a vertical sectional area of the heat treating space.

14. The substrate treating method according to claim 2, wherein the exhaust step performs the exhaust of the gas from an exhaust port that is formed laterally of the heat treating chamber and has a flow sectional area corresponding to a vertical sectional area of the heat treating space.

15. The substrate treating method according to claim 3, wherein the exhaust step performs the exhaust of the gas from an exhaust port that is formed laterally of the heat treating chamber and has a flow sectional area corresponding to a vertical sectional area of the heat treating space.

16. The substrate treating method according to claim 4, wherein the exhaust step performs the exhaust of the gas from an exhaust port that is formed laterally of the heat treating chamber and has a flow sectional area corresponding to a vertical sectional area of the heat treating space.

17. The substrate treating method according to claim 7, wherein the exhaust step performs the exhaust of the gas from an exhaust port that is formed laterally of the heat treating chamber and has a flow sectional area corresponding to a vertical sectional area of the heat treating space.

18. The substrate treating method according to claim 10, wherein the exhaust step performs the exhaust of the gas from an exhaust port that is formed laterally of the heat treating chamber and has a flow sectional area corresponding to a vertical sectional area of the heat treating space.

19. The substrate treating method according to claim 1, wherein the exhaust step performs the exhaust of the gas from through holes into which support pins moving forward/backward in a heat treating plate for placing the substrate placed are inserted in communication with the heat treating space.

20. The substrate treating method according to claim 1, wherein the substrate has a treated film formed thereon that is made from a directed self-assembly material.

* * * * *